United States Patent
Huang (10) Patent No.: US 10,224,282 B2
(45) Date of Patent: Mar. 5, 2019

(54) PROTECTION DEVICE AND OPERATION SYSTEM UTILIZING THE SAME

(71) Applicant: Vanguard International Semiconductor Corporation, Hsinchu (TW)

(72) Inventor: Shao-Chang Huang, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 101 days.

(21) Appl. No.: 15/198,494

(22) Filed: Jun. 30, 2016

(65) Prior Publication Data
US 2018/0006012 A1    Jan. 4, 2018

(51) Int. Cl.
| H01L 27/02 | (2006.01) |
| H01L 23/528 | (2006.01) |
| H01L 27/08 | (2006.01) |
| H01L 21/8238 | (2006.01) |

(52) U.S. Cl.
CPC ...... *H01L 23/5286* (2013.01); *H01L 27/0255* (2013.01); *H01L 27/0814* (2013.01); *H01L 21/823892* (2013.01)

(58) Field of Classification Search
CPC ............. H01L 27/0248; H01L 23/5286; H01L 27/0814
USPC ......................................................... 257/546
See application file for complete search history.

(56) References Cited

U.S. PATENT DOCUMENTS

2015/0380396 A1* 12/2015 Su ....................... H01L 27/0248
257/140

* cited by examiner

*Primary Examiner* — Hrayr A Sayadian
(74) *Attorney, Agent, or Firm* — Birch, Stewart, Kolasch & Birch, LLP (57) ABSTRACT

A protection device including a substrate, a first doped region, a first well region, a second doped region, a third doped region, a fourth doped region, a second well region, a fifth doped region, and a sixth doped region is provided. The substrate, the first well region, and the third and the fifth doped regions have a first conductivity type. The first doped and the second well regions are disposed in the substrate. The first, second, fourth, and sixth doped regions and the second well region have a second conductivity type. The first well and the second doped regions are disposed in the first doped region. The second doped region is not in contact with the first well region. The third and fourth doped regions are disposed in the first well region. The fifth and sixth doped regions are disposed in the second well region.

20 Claims, 9 Drawing Sheets

PROTECTION DEVICE AND OPERATION SYSTEM UTILIZING THE SAME

BACKGROUND OF THE INVENTION

Field of the Invention

The invention relates to a protection device, and more particularly to a protection device comprising diodes.

Description of the Related Art

Generally, every semiconductor integrated circuit is constituted by many semiconductor circuits. For some semiconductor circuits, the operation voltages may be the same. Therefore, the power terminals of the semiconductor circuits are coupled to each other when the power terminals receive the same operation voltage. Similarly, the ground terminals of the semiconductor circuits are coupled to each other when the ground terminals receive the same operation voltage. However, when the voltage level of one power terminal or one ground terminal is changed, the changed voltage level will interfere with other voltage levels in other power terminals or ground terminals. Therefore, the operation of the semiconductor circuits is interfered with by the changes in the voltage levels.

BRIEF SUMMARY OF THE INVENTION

In accordance with an embodiment, a protection device comprises a substrate, a first doped region, a first well region, a second doped region, a third doped region, a fourth doped region, a second well region, a fifth doped region, and a sixth doped region. The substrate has a first conductivity type. The first doped region is disposed in the substrate and has a second conductivity type. The first well region is disposed in the first doped region and has the first conductivity type. The second doped region is disposed in the first doped region and has the second conductivity type. The second doped region is not in contact with the first well region. The third doped region is disposed in the first well region and has the first conductivity type. The fourth doped region is disposed in the first well region and has the second conductivity type. The second well region is disposed in the substrate and has the second conductivity type. The fifth doped region is disposed in the second well region and has the first conductivity type. The sixth doped region is disposed in the second well region and has the second conductivity type.

In accordance with another embodiment, an operation system comprises a first semiconductor circuit, a second semiconductor circuit, and a protection device. The first semiconductor circuit is coupled to a first power terminal and a first ground terminal to receive a first operation voltage and a second operation voltage. The first operation voltage is larger than the second operation voltage. The second semiconductor circuit is coupled to a second power terminal and a second ground terminal to receive a third operation voltage and a fourth operation voltage. The third operation voltage is larger than the fourth operation voltage. The protection device is coupled to at least one of the first power terminal, the first ground terminal, the second power terminal, and the second ground terminal and comprises a substrate, a first doped region, a first well region, a second doped region, a third doped region, a fourth doped region, a second well region, a fifth doped region, and a sixth doped region. The substrate has a first conductivity type. The first doped region is disposed in the substrate and has a second conductivity type. The first well region is disposed in the first doped region and has the first conductivity type. The second doped region is disposed in the first doped region and has the second conductivity type. The second doped region is not in contact with the first well region. The third doped region is disposed in the first well region and has the first conductivity type. The fourth doped region is disposed in the first well region and has the second conductivity type. The second well region is disposed in the substrate and has the second conductivity type. The fifth doped region is disposed in the second well region and has the first conductivity type. The sixth doped region is disposed in the second well region and has the second conductivity type.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
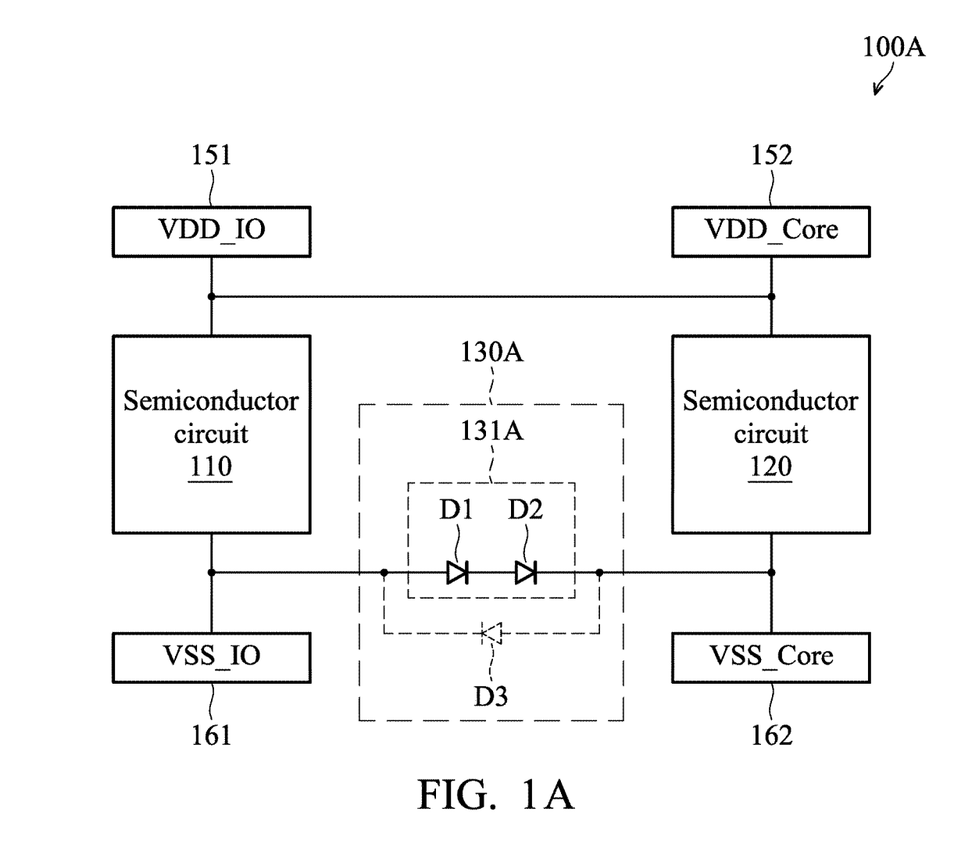
FIGS. 1A~1C are schematic diagrams of exemplary embodiments of an operation system, according to various aspects of the present disclosure.

FIG. 1A is a schematic diagram of an exemplary embodiment of an operation system, according to various aspects of the present disclosure. The operation system 100A comprises semiconductor circuits 110 and 120 and a protection device 130A. The semiconductor circuit 110 is coupled to a power terminal 151 and a ground terminal 161. The power terminal 151 is configured to receive an operation voltage VDD_IO. The ground terminal 161 is configured to receive another operation voltage VSS_IO. In this embodiment, the operation voltage VDD_IO is larger than the operation voltage VSS_IO.

The semiconductor circuit 120 is coupled to a power terminal 152 and a ground terminal 162. The power terminal 152 is configured to receive an operation voltage VDD_Core. The ground terminal 162 is configured to receive another operation voltage VSS_Core. In this embodiment, the operation voltage VDD_Core is larger than the operation voltage VSS_Core. In another embodiment, the operation voltage VDD_IO is similar to the operation voltage VDD_Core, and the operation voltage VSS_IO is similar to the operation voltage $VSS_{Core}$.

The protection device 130A is coupled between the ground terminals 161 and 162 to avoid the voltage level of the ground terminal 162 interfering with the voltage level of the ground terminal 161. In this embodiment, the protection device 130A comprises a diode string 131A. The diode string 131A comprises diodes D1 and D2. The anode of the diode D1 is coupled to the ground terminal 161. The cathode of the diode D1 is coupled to the anode of the diode D2. The cathode of diode D2 is coupled to the ground terminal 162. When the operation voltage VSS_IO received by the ground terminal 162 is increased, the operation voltage VSS_Core received by the ground terminal 162 does not interfere with the increased operation voltage VSS_IO. The invention does not limit the number of diodes. In other embodiment, the diode string 131A comprises three or more diodes.

In this embodiment, the type of the first diode in the diode string 131A is different from the type of the second diode in the diode string 131A. For example, the diode D1 is an N+/PW diode, and the diode D2 is a P+/NW diode. In another embodiment, the diode D1 is a P+/NW diode, and the diode D2 is an N+/PW diode. In other embodiments, when the diode string 131A comprises many diodes, at least one of the diodes is an N+/PW diode, and at least one other diode is a P+/NW diode. The structures of the N+/PW diode and the P+/NW diode are described in the following paragraphs.

In some embodiments, the protection device 130A further comprises a diode D3, but the disclosure is not limited thereto. In other embodiments, the diode D3 is omitted. The diode D3 is configured to prevent an electrostatic discharge (ESD) from the ground terminal 162 from entering the ground terminal 161 and thereby interfering with the proper operation of the semiconductor circuit 110. In this embodiment, the anode of the diode D3 is coupled to the ground terminal 162. The cathode of the diode D3 is coupled to the ground terminal 161.

Figure 1B:
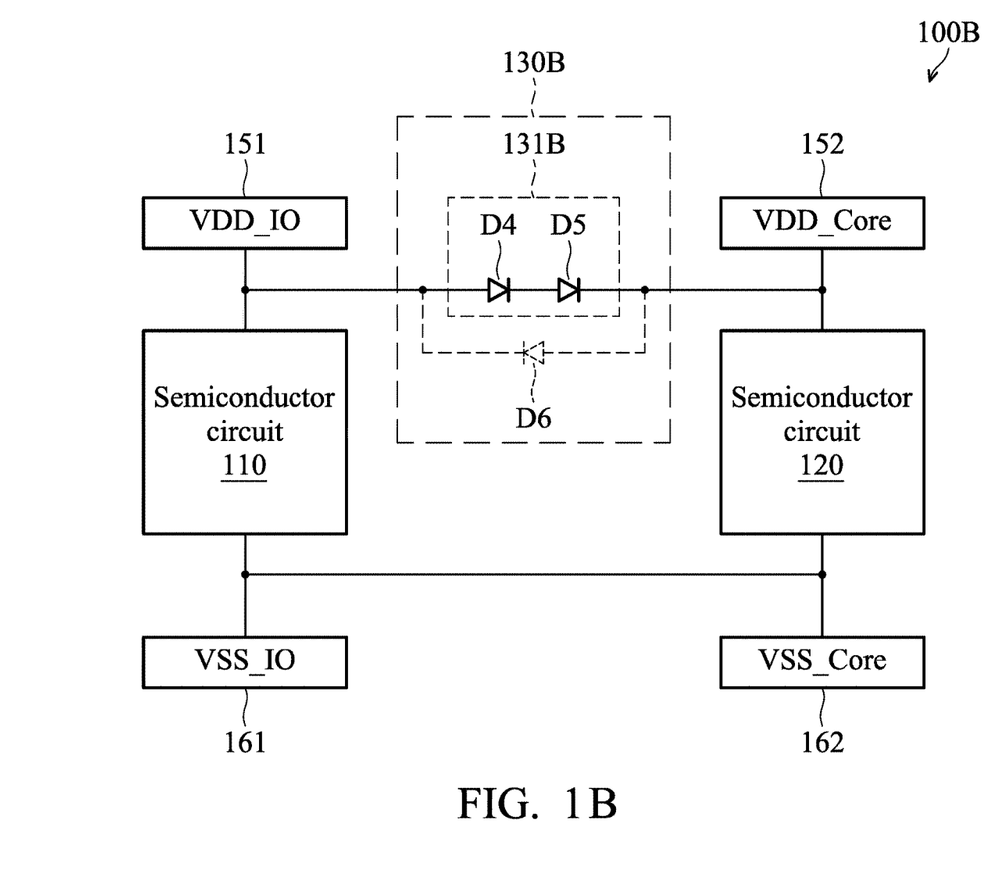

FIG. 1B is a schematic diagram of another exemplary embodiment of the operation system, according to various aspects of the present disclosure. FIG. 1B is similar to FIG. 1A except that the protection device 130B shown in FIG. 1B is coupled between the power terminals 151 and 152 to avoid having the operation voltage VDD_IO interfere with the operation voltage VDD_Core. Since the structure and operation of the protection device 130B are similar to the structure and operation of the protection device 130A shown in FIG. 1A, the structure and operation of the protection device 130B are omitted for brevity.

Figure 1C:
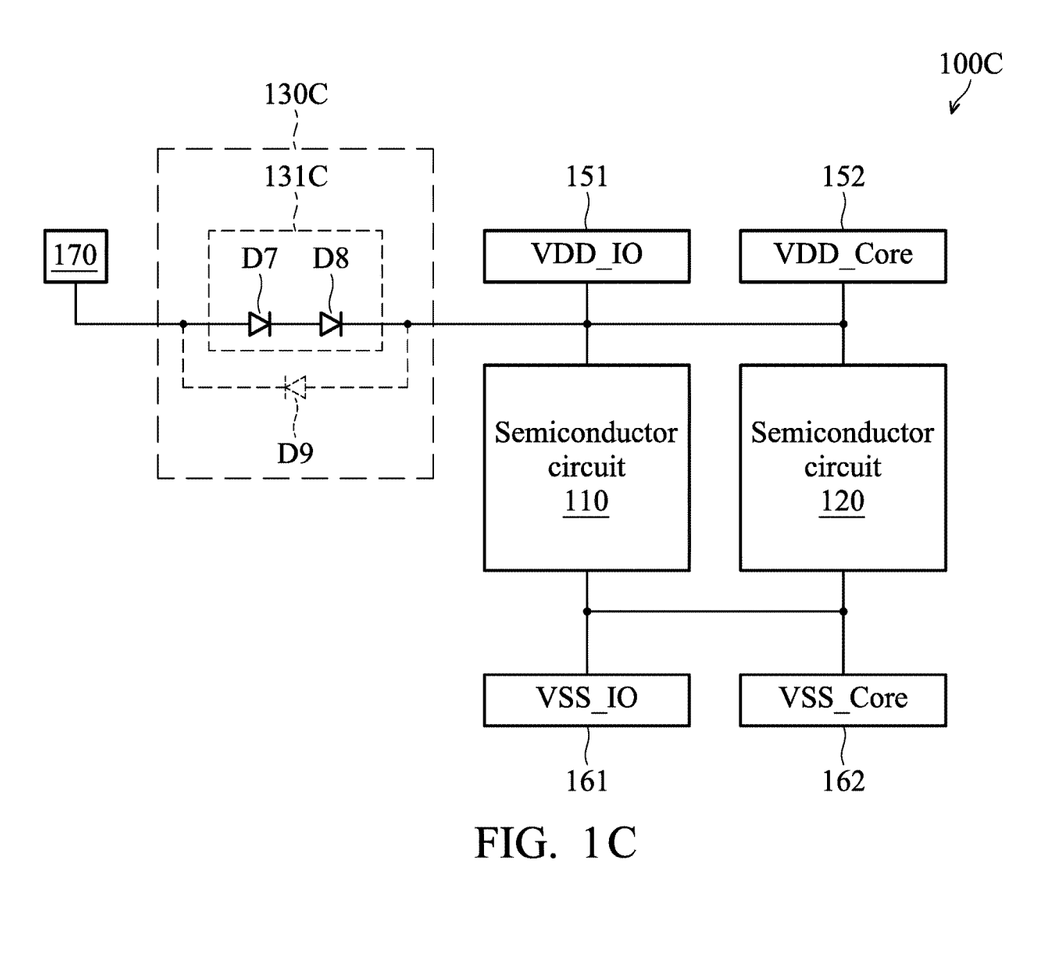

FIG. 1C is a schematic diagram of another exemplary embodiment of the operation system, according to various aspects of the present disclosure. FIG. 1C is similar to FIG. 1A with the exception that the protection device 130C is coupled between the power terminal 151 and an input/output pad 170 to avoid the voltage level of the input/output pad 170 interfering with the operation voltage VDD_IO. Since the structure and operation of the protection device 130C are the same as the structure and operation of the protection device 130A, a description of the structure and operation of the protection device 130C is omitted.

Figure 2A:
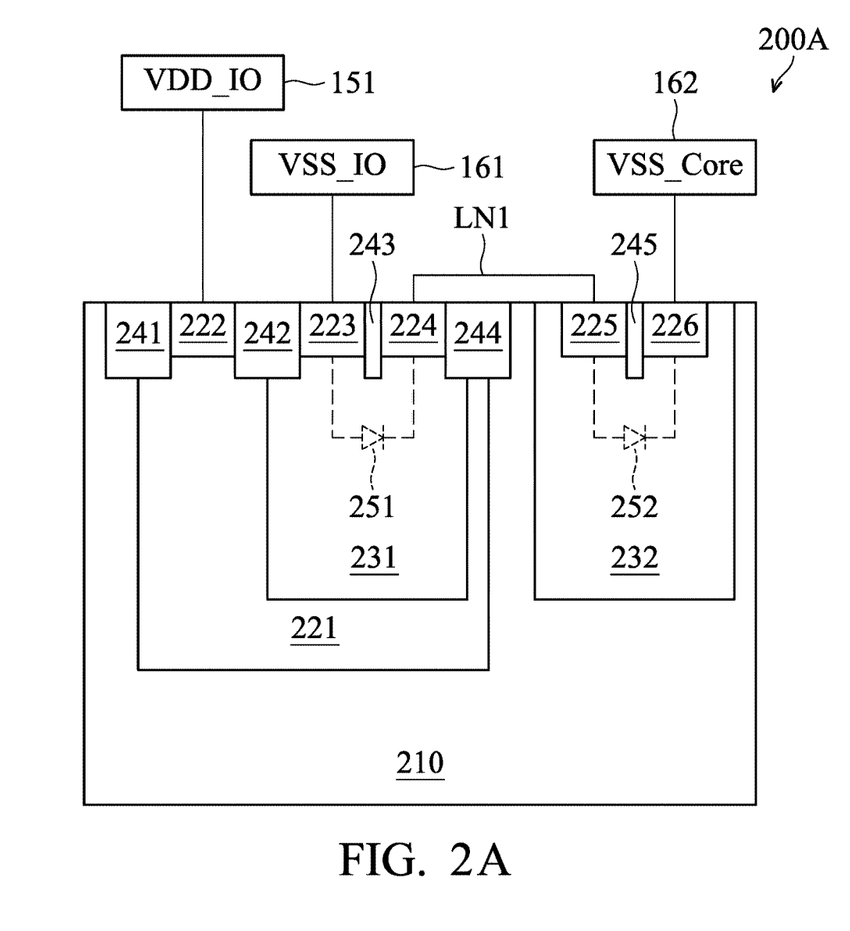
FIGS. 2A~2C are schematic diagrams of exemplary embodiments of a protection device, according to various aspects of the present disclosure.

FIG. 2A is a schematic diagram of an exemplary embodiment of the protection device, according to various aspects of the present disclosure. The protection device 200A comprises a substrate 210, doped regions 221~226, well regions 231~232, and isolation structures 241~245. The substrate 210 has the first conductivity type. The substrate 210 may include, but is not limited to, a semiconductor substrate such as a silicon substrate. In addition, the substrate 210 may include an element semiconductor which may include germanium; a compound semiconductor which may include silicon carbide, gallium arsenide, gallium phosphide, indium phosphide, indium arsenide and/or indium antimonide, alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 210 may include a semiconductor-on-insulator. In one embodiment, the substrate 210 may be an un-doped substrate. However, in other embodiments, the substrate 210 may be a lightly doped substrate such as a lightly doped P-type substrate or a lightly doped N-type substrate.

The doped region 221 is disposed in the substrate 210 and has a second conductivity type. The first conductivity type is opposite to the second conductivity type. For example, when the first conductivity type is p-type, the second conductivity type is n-type. On the contrary, when the first conductivity type is n-type, the second conductivity type is p-type. In one embodiment, the doped region 221 may be formed by ion implantation. For example, when the second conductive type is n-type, the predetermined region for the doped region 221 may be implanted with phosphorous ions or arsenic ions to form the doped region 221. However, when the second conductive type is p-type, the predetermined region for the doped region 221 may be implanted with boron ion or indium ion to form the doped region 221. In this embodiment, the doped region 221 is a deep well region to surround the well region 231.

The well region 231 is disposed in the doped region 221 and has the first conductivity type. The doped region 222 is disposed in the doped region 221 and has the second conductivity type. The doped region 222 is not in contact with the well region 231. The doped region 223 is disposed in the well region 231 and has the first conductivity type. The doped region 224 is disposed in the well region 231 and has the second conductivity type. In this embodiment, the doped regions 223 and 224 constitute a diode 251. When the first conductivity type is p-type and the second conductivity type is n-type, the diode 251 is an N+/PW diode. Conversely, when the first conductivity type is n-type and the second conductivity type is p-type, the diode 251 is a P+/NW diode.

The well region 232 is disposed in the substrate 210 and has the second conductivity type. The doped region 225 is disposed in the well region 232 and has the first conductivity type. The doped region 226 is disposed in the well region 232 and has the second conductivity type. In this embodiment, the doped regions 225 and 226 constitute a diode 252. When the first conductivity type is p-type and the second conductivity type is n-type, the diode 252 is a P+/NW diode. On the contrary, when the first conductivity type is n-type and the second conductivity type is p-type, the diode 251 is an N+/PW diode.

Additionally, each of the doped regions 221, 222, 224, and 226 and the well region 232 has the second conductivity type. In one embodiment, the doping concentrations of the doped regions 222, 224, and 226 are the same and are larger than the doping concentration of the doped region 221 and the well region 232. In addition, each of the substrate 210, the well region 231, and doped regions 223 and 225 has the first conductivity type. In one embodiment, the doping concentration of the doped region 223 is similar to the doping concentration of the doped region 225 and larger than the doping concentrations of the substrate 210 and the well region 231.

The isolation structures 241~245 are configured to isolate the doped regions 222~226. In this embodiment, the doped region 222 is disposed between the isolation structures 241 and 242. The doped region 223 is disposed between the isolation structures 242 and 243. The doped region 224 is disposed between the isolation structures 243 and 244. The isolation structure 245 is disposed between the doped regions 225 and 226. In one embodiment, the isolation structures 241~245 are STI structures. The formations of the isolation structures 241~245 includes patterning the substrate 210 by a photolithography process, etching a recess, such as a trench, in the substrate 210 (for example, by using dry etching, wet etching, other applicable etching processes, or a combination thereof), and filling the recess (for example, by using chemical vapor deposition).

In this embodiment, a conductive line LN1 is electrically connected to the doped regions 224 and 225 to serially connect the diodes 251 and 252. The serially connected diodes 251 and 252 can serve as one of the diode strings 131A~131C shown in FIGS. 1A~1C. For brevity, assume that the diodes 251 and 252 shown in FIG. 2A are serving as the diodes D1 and D2 shown in FIG. 1A. As shown in FIG. 1A, since the anode of the diode D1 is coupled to the ground terminal 161 and the cathode of the diode D2 is coupled to the ground terminal 162, the doped region 223 shown in FIG. 2A is electrically connected to the ground terminal 161 and the doped region 226 shown in FIG. 2A is electrically connected to the ground terminal 162. In this case, the doped region 222 is electrically connected to the power terminal 151, but the disclosure is not limited thereto. The doped region 222 can be electrically connected to one power terminal 151 or is in a floating state.

In other embodiments, the series of diodes 251 and 252 can serve as the diodes D4 and D5 shown in FIG. 1B. In this case, the doped region 223 is required to be electrically connected to the power terminal 151, and the doped region 226 is required to be electrically connected to the power terminal 152. At this time, the doped region 222 can be coupled to the power terminal 151 or is in a floating state.

Additionally, serial diodes 251 and 252 can serve as the diodes D7 and D8 shown in FIG. 1C. In this case, the doped region 223 shown in FIG. 2A is required to be electrically connected to the input/output terminal 170, and the doped region 226 is required to be electrically connected to the power terminal 151. At this time, the doped region 222 can be coupled to the power terminal 151 or is in a floating state.

Figure 2B:
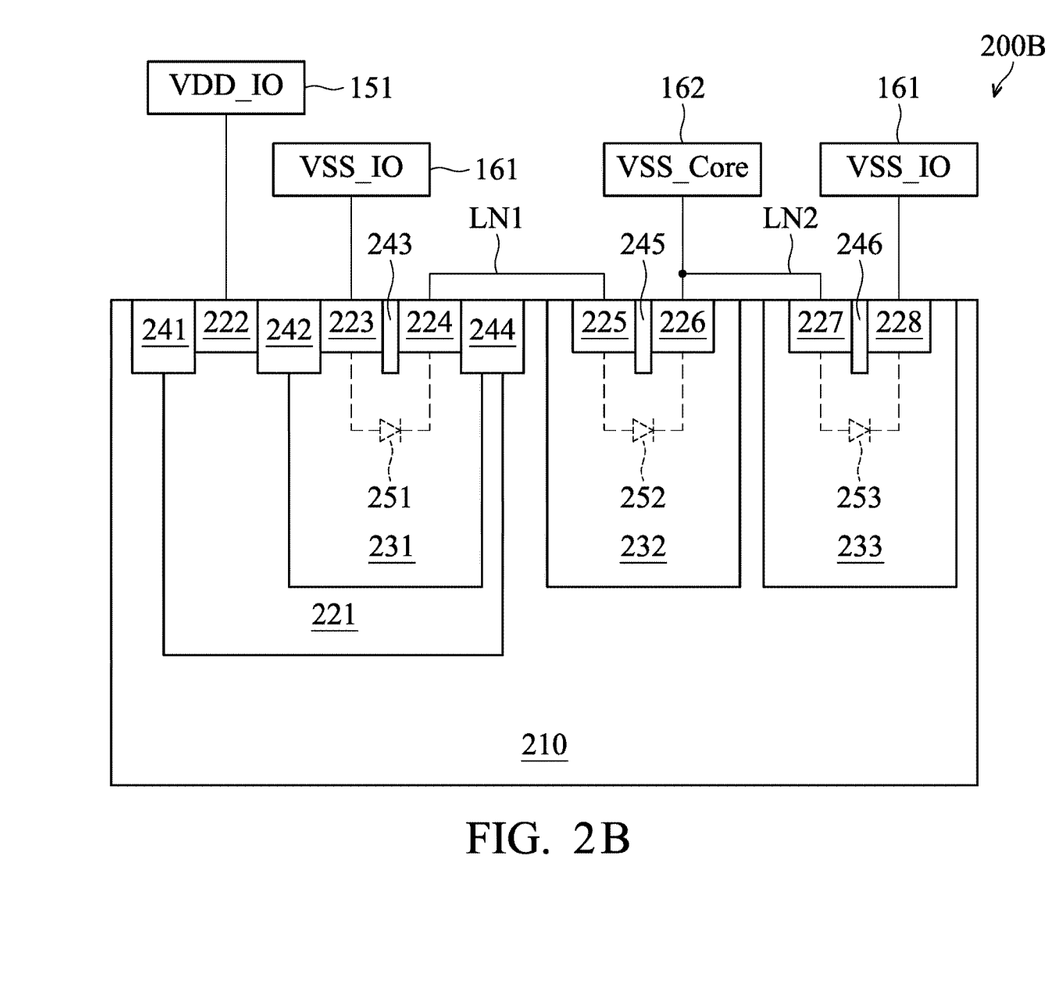

FIG. 2B is a schematic diagram of an exemplary embodiment of the protection device, according to various aspects of the present disclosure. FIG. 2B is similar to FIG. 2A except that the protection device 200B shown in FIG. 2B further comprises a well region 233, doped regions 227 and 228, and an isolation structure 246. In this embodiment, the well region 233 is disposed in the substrate 210 and has a second conductivity type. In one embodiment, the doping concentration of the well region 233 is similar to the doping concentration of the well region 232.

The doped region 227 is disposed in the well region 233 and has a first conductivity type. In one embodiment, the doping concentration of the doped region 227 is similar to the doping concentration of the doped region 223. Furthermore, the doped region 228 is disposed in the well region 233 and has the second conductivity type. The isolation structure 246 is disposed between the doped regions 227 and 228. In one embodiment, the doping concentration of the doped region 228 is similar to the doping concentration of the doped region 224. In this embodiment, the doped regions 227 and 228 constitute a diode 253.

In one embodiment, the diode 253 can serve as the diode D3 shown in FIG. 1A. In FIG. 1A, the anode of the diode D3 is coupled to the ground terminal 162, and the cathode of the diode D3 is coupled to the ground terminal 161. Therefore, the doped region 227 shown in FIG. 2B is electrically connected to the ground terminal 162 via the conductive line LN2, and the doped region 228 is electrically connected to the ground terminal 161. In other embodiments, the diode 253 can also serve as the diode D6 shown in FIG. 1B. In this case, the doped region 227 shown in FIG. 2B is modified to electrically connect to the power terminal 152, and the doped region 228 is modified to electrically connect to the power terminal 151. Additionally, the diode 253 is also served as the diode D9 shown in FIG. 1C. In this case, the doped region 227 shown in FIG. 2B is modified to electrically connect to the power terminal 151. Further, the doped region 228 is modified to electrically connect to the input/output terminal 170.

Figure 2C:
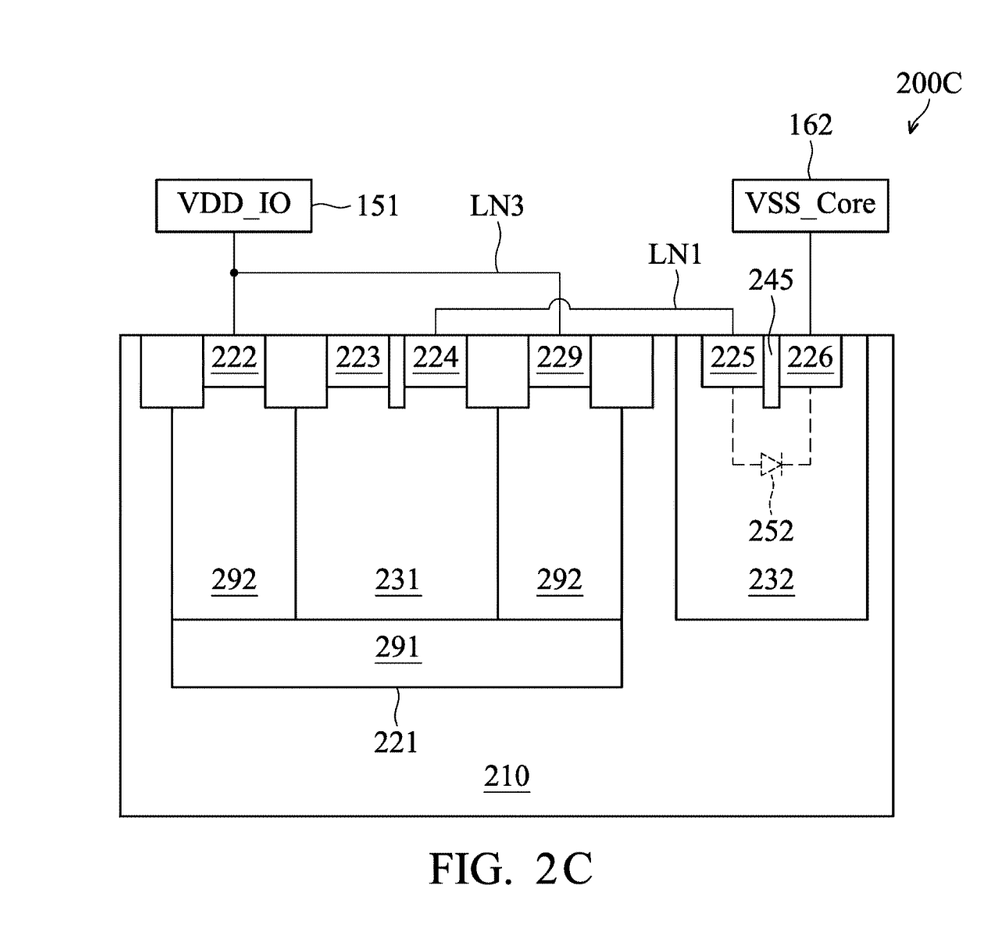

FIG. 2C is a schematic diagram of an exemplary embodiment of the protection device, according to various aspects of the present disclosure. FIG. 2C is similar to FIG. 2A with the exception that the doped region 221 shown in FIG. 2C comprises a buried layer 291 and a well region 292. The buried layer 291 has the second conductivity type. When the second conductivity type is n-type, the buried layer 291 is referred to as an N-type buried layer (NBL). Conversely, when the second conductivity type is p-type, the buried layer 291 is referred to as a P-type buried layer (PBL). The well region 292 is disposed on the buried layer 291 and has a second conductivity type. The well region 231 is surrounded by the well region 292. In this embodiment, the doped region 292 is electrically connected to the power terminal 151 via a conductive line LN3.

Figure 3A:
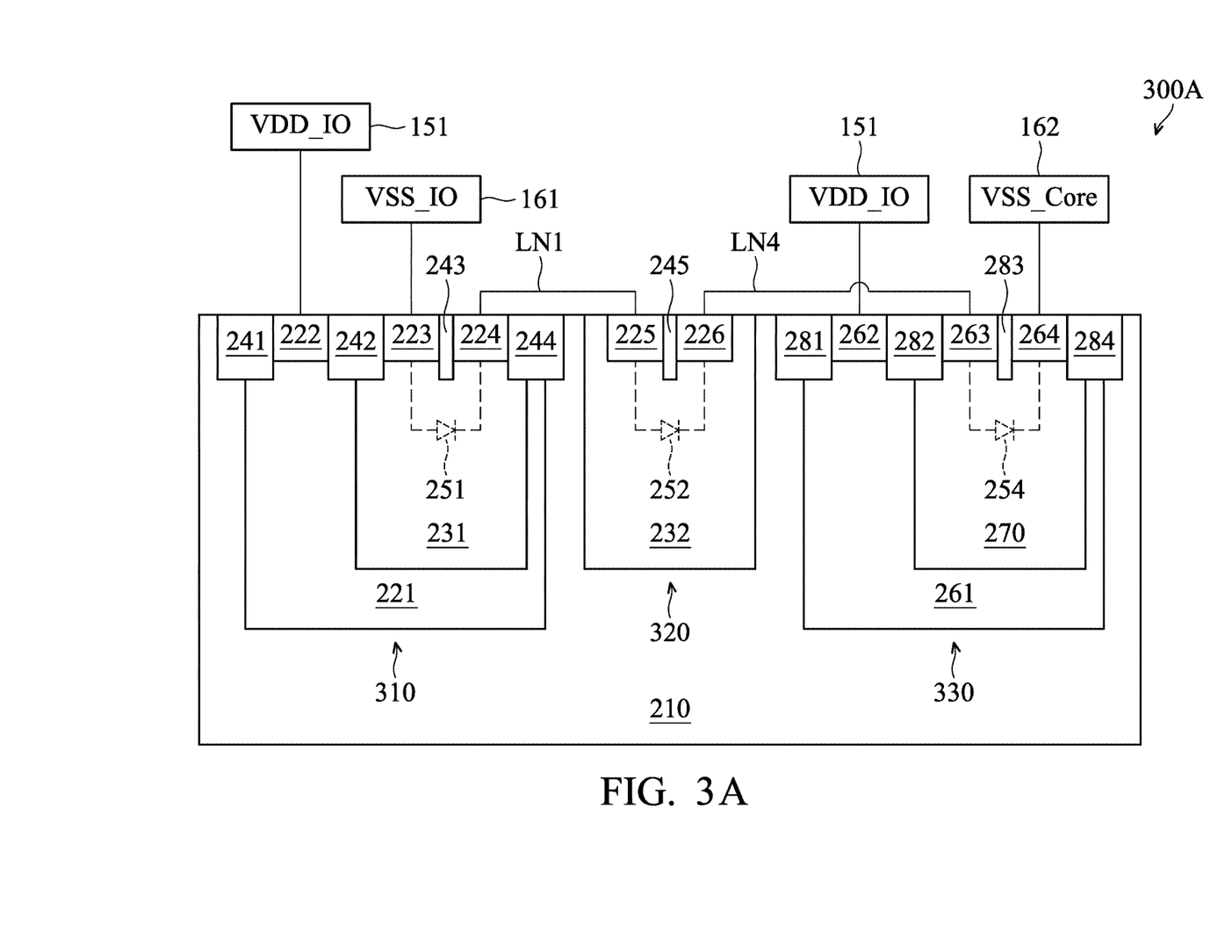
FIGS. 3A~3C are schematic diagrams of exemplary embodiments of the protection device, according to various aspects of the present disclosure.

FIG. 3A is a schematic diagram of an exemplary embodiment of the protection device, according to various aspects of the present disclosure. FIG. 3A is similar to FIG. 2A except that the protection device 300A shown in FIG. 3A further comprises doped regions 261~264, a well region 270, and isolation structures 281~284. The doped region is disposed in the substrate 210 and has the second conductivity type. In this embodiment, the doped region 261 is a deep well region to surround the well region 270. In other embodiments, the doped region 261 is similar to the doped region 221 shown in FIG. 2C and comprises a buried layer and a well region with the second conductivity type.

The well region 270 is disposed in the doped region 261 and has the first conductivity type. The doped region 262 is disposed in the doped region 261 and has the second conductivity type. The doped region 262 is not in contact with the well region 270. The doped region 263 is disposed in the well region 270 and has the first conductivity type. The doped region 264 is disposed in the well region 270 and has the second conductivity type. In this embodiment, each of the doped regions 261, 262, and 264 has the second conductivity type. The doping concentration of the doped region 262 is similar to the doping concentration of the doped region 264. Each of the doping concentrations of the doped regions 262 and 264 is larger than the doping concentration of the doped region 261. In some embodiments, the doping concentration of the doped region 262 is similar to the doping concentration of the doped region 222. Additionally the doping concentration of the doped region 261 is similar to the doping concentration of the doped region 221.

Each of the doped region 263 and the well region 270 has the first conductivity type. The doping concentration of the doped region 263 is larger than the doping concentration of the well region 270. In one embodiment, the doping concentration of the doped region 263 is similar to the doping concentration of the doped region 223. The doping concentration of the well region 270 is similar to the doping concentration of the well region 231.

In this embodiment, the doped regions 263 and 264 constitute a diode 254. Since the doped region 263 is electrically connected to the doped region 226 via the conductive line LN4, the diodes 251, 252, and 254 are connected in series to serve as a diode string.

Assuming that the first conductivity type is p-type and the second conductivity type is n-type, then diodes 251 and 254 are N+/PW diodes, and diode 252 is a P+/NW diode. In other embodiments, if the first conductivity type is n-type and the second conductivity type is p-type, then diodes 251 and 254 are referred to as P+/NW diodes, and diode 252 is referred to as an N+/PW diode.

Assuming that diodes 251, 252, 254 are serving as the diode string 131A, then the doped region 223 needs to be electrically connected to the ground terminal 161, and the doped region 264 is required to be electrically connected to the ground terminal 162. In this case, the doped regions 222 and 262 can be electrically connected to the power terminal 151, but the disclosure is not limited thereto. In some embodiments, the doped regions 222 and 262 can be electrically connected to the ground terminal 161 or in a floating state.

In FIG. 3A, the block 310 comprises the doped regions 221~224, the well region 231, and isolation structures 241~244. The block 320 comprises the doped regions 225~226, the well region 232, and the isolation structure 245. The block 330 comprises the doped regions 261~264, the well region 270, and isolation structures 281~284. In this embodiment, the block 320 is located between the blocks 310 and 330. Therefore, the diode 252 is serially connected between the diodes 251 and 254. In this case, the type of the diode 251 is the same as the type of the diode 254 and is different from the type of the diode 252.

In some embodiments, the semiconductor structure of the block 330 may be similar to that of the block 320. In this case, the type of the diode 252 is the same as the type of the diode 254, such as a P+/NW diode or an N+/PW diode. In another embodiment, the semiconductor structure of the block 310 may be similar to that of the block 320. In this case, the type of the diode 251 is the same as the type of the diode 252, such as the P+/NW diode or the N+/PW diode.

Figure 3B:
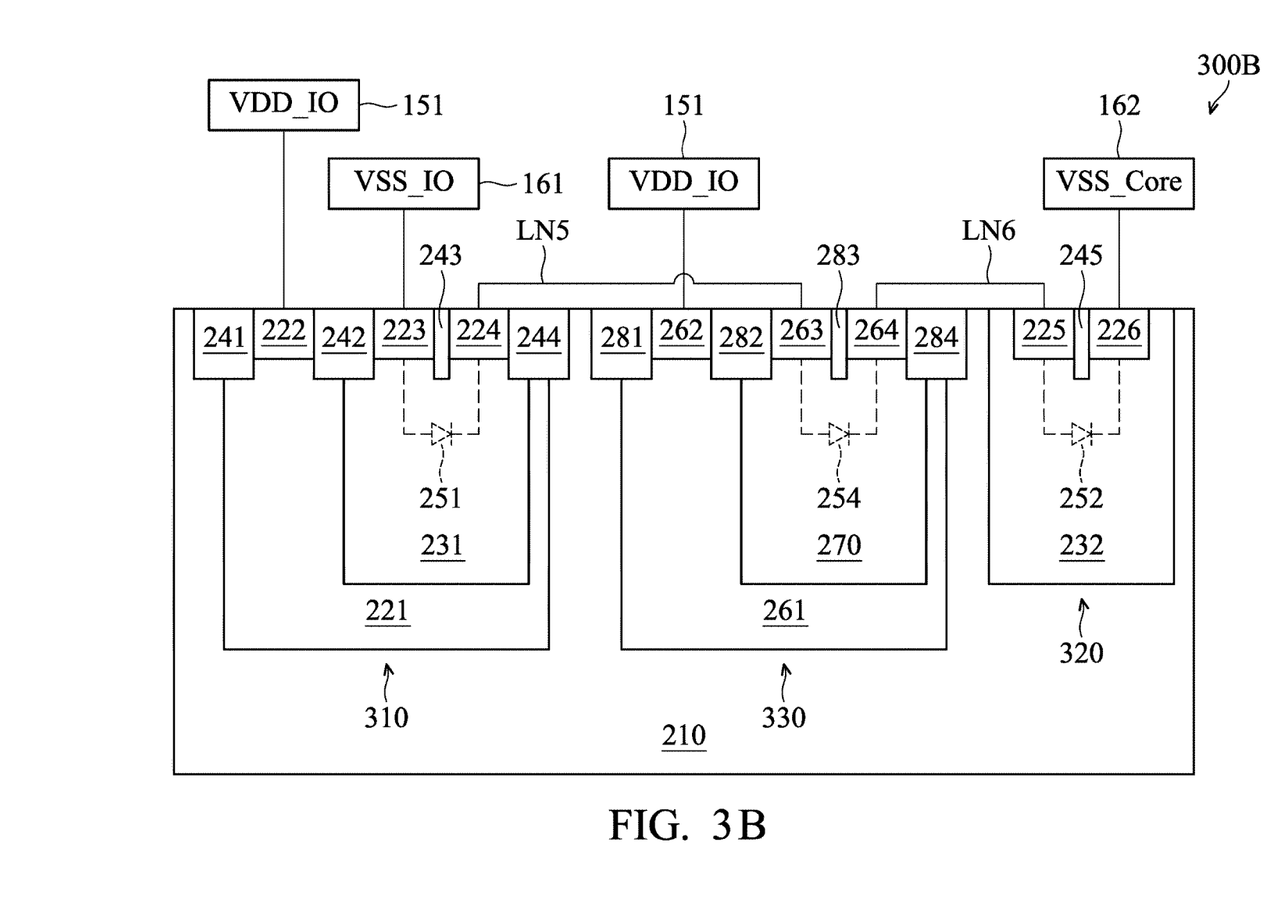

FIG. 3B is a schematic diagram of an exemplary embodiment of the protection device, according to various aspects of the present disclosure. FIG. 3B is similar to FIG. 3A except that the position of the block 330 is between the blocks 310 and 320, the doped region 224 is electrically connected to the doped region 263 via the conductive line LN5, and the doped region 264 is electrically connected to the doped region 225 via the conductive line LN6. Therefore, the diode 254 is serially connected between the diodes 251 and 252 in FIG. 3B.

In the present invention, the positions of the blocks 310, 320, and 330 are not limited. When the diodes in the blocks 310, 320, and 330 are connected to each other in series, the series diodes can serve as the diode string 131A, 131B, or 131C. In FIG. 3A, the block 320 is disposed between the blocks 310 and 330. In FIG. 3B, the block 330 is disposed between the blocks 310 and 320. In other embodiments, the block 310 may be disposed between the blocks 320 and 330. In this case, the block 320 is on the left side of the block 310, and the block 330 is on the right side of the block 310.

Figure 3C:
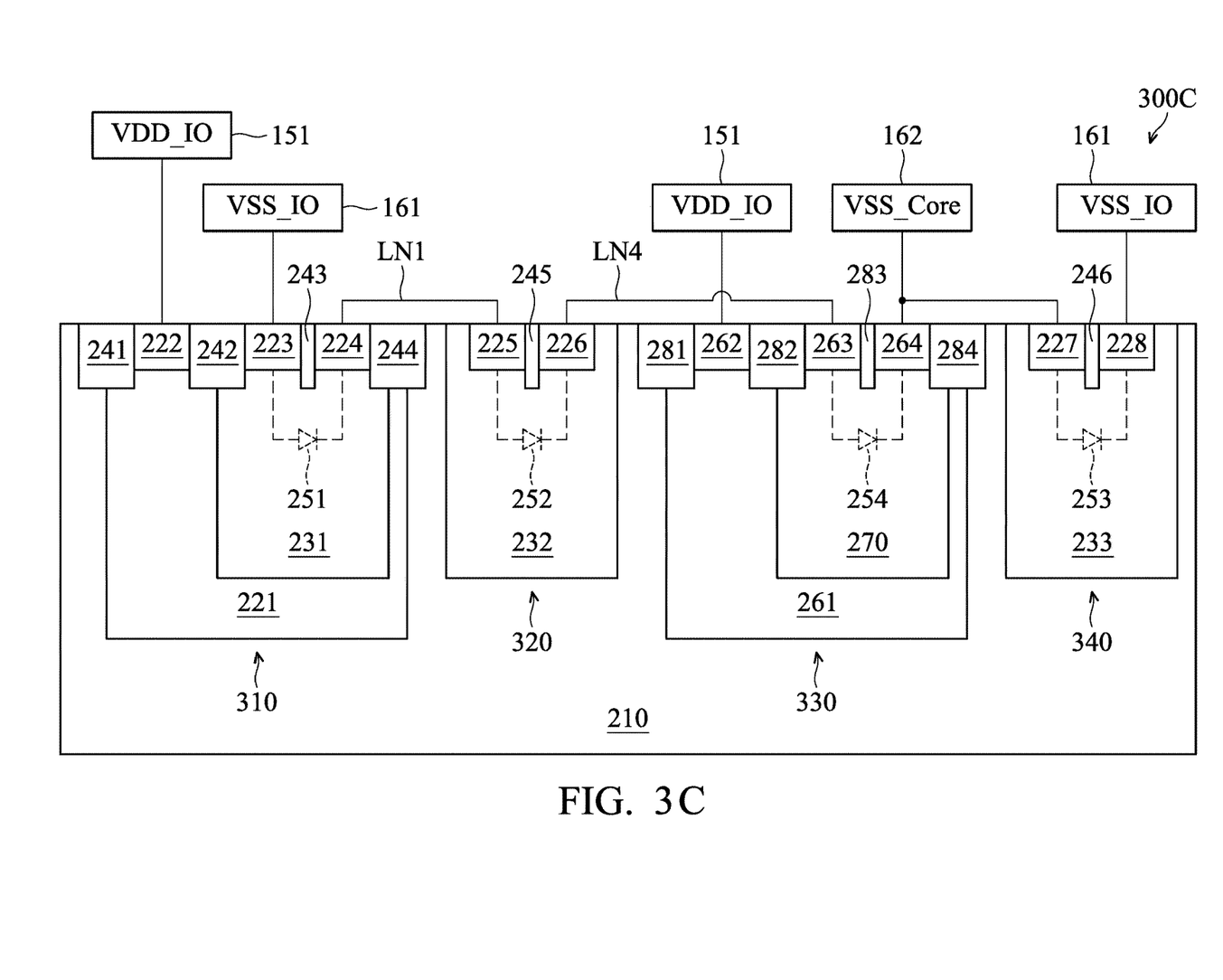

FIG. 3C is a schematic diagram of an exemplary embodiment of the protection device, according to various aspects of the present disclosure. FIG. 3C is similar to FIG. 3A except that the protection device 300C shown in FIG. 3C further comprises a block 340. The block 340 provides a diode 253. In this embodiment, the block 340 comprises a well region 233, doped regions 227 and 228, and an isolation structure 246. The doped regions 227 and 228 constitute the diode 253. When the doped region 227 is electrically connected to the ground terminal 162 and the doped region 228 is electrically connected to the ground terminal 161, the diode 253 is connected to the diode string in parallel, wherein the diode string is constituted by the diodes 251, 252, and 254 to release an ESD current from the ground terminal 162 to the ground terminal 161. In other embodiments, the semiconductor structure of the block 340 can be applied to FIG. 3B.

In the present invention, the number of the diodes in a single diode string is not limited. The diode string comprises a plurality of diodes. Among the diodes, a first diode is an N+/PW diode, a second diode is a P+/NW diode, and the others may be N+/PW diodes or P+/NW diodes. Furthermore, the invention does not limit the arrangement of the N+/PW diode and the P+/NW diode. In one embodiment, a first N+/PW diode may be serially connected between two P+/NW diodes, or connected between an N+/PW diode and a second P+/NW diode. Additionally, a first P+/NW diode may be serially connected between two N+/PW diodes as shown in FIG. 3A, or connected between a second P+/NW diode and an N+/PW diode.

Unless otherwise defined, all terms (including technical and scientific terms) used herein have the same meaning as commonly understood by one of ordinary skill in the art to which this invention belongs to. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A protection device, comprising:
   a substrate having a first conductivity type;
   a first doped region disposed in the substrate and having a second conductivity type;
   a first well region disposed in the first doped region and having the first conductivity type;
   a second doped region disposed in the first doped region and having the second conductivity type, wherein the second doped region is not in contact with the first well region;
   a third doped region disposed in the first well region and having the first conductivity type;
   a fourth doped region disposed in the first well region and having the second conductivity type;
   a second well region disposed in the substrate and having the second conductivity type;
   a fifth doped region disposed in the second well region and having the first conductivity type; and
   a sixth doped region disposed in the second well region and having the second conductivity type,
   wherein the first conductivity type is different from the second conductivity type.

2. The protection device as claimed in claim 1, wherein the first conductivity type is n-type and the second conductivity type is p-type.

3. The protection device as claimed in claim 1, wherein the first conductivity type is p-type and the second conductivity type is n-type.

4. The protection device as claimed in claim 1, wherein the first doped region is a deep well region.

5. The protection device as claimed in claim 1, wherein the first doped region comprises:

a buried layer having the second conductivity type; and
a third well region disposed on the buried layer and having the second conductivity type, wherein the first well region is surrounded by the third well region.

6. The protection device as claimed in claim 1, further comprising:
a first conductive line electrically connected to the fourth and fifth doped regions.

7. The protection device as claimed in claim 1, further comprising:
a seventh doped region disposed in the substrate and having the second conductivity type;
a third well region disposed in the seventh doped region and having the first conductivity type;
an eighth doped region disposed in the seventh doped region and having the second conductivity type, wherein the eighth doped region is not in contact with the third well region;
a ninth doped region disposed in the third well region and having the first conductivity type; and
a tenth doped region disposed in the third well region and having the second conductivity type.

8. The protection device as claimed in claim 7, further comprising:
a first conductive line electrically connected to the fourth and fifth doped regions; and
a second conductive line electrically connected to the sixth and ninth doped regions.

9. The protection device as claimed in claim 7, further comprising:
a first conductive line electrically connected to the fourth and ninth doped regions; and
a second conductive line electrically connected to the fifth and tenth doped regions.

10. The protection device as claimed in claim 7, wherein the first doped region is a first deep well region and the seventh doped region is a second deep well region.

11. The protection device as claimed in claim 7, wherein the first doped region further comprises:
a first buried layer having the second conductivity type; and
a fourth well region disposed on the first buried layer, surrounding the first well region, and having the second conductivity type,
wherein the seventh doped region further comprises:
a second buried layer having the second conductivity type; and
a fifth well region disposed on the second buried layer, surrounding the third well, and having the second conductivity type.

12. An operation system comprising:
a first semiconductor circuit coupled to a first power terminal and a first ground terminal to receive a first operation voltage and a second operation voltage, wherein the first operation voltage is larger than the second operation voltage;
a second semiconductor circuit coupled to a second power terminal and a second ground terminal to receive a third operation voltage and a fourth operation voltage, wherein the third operation voltage is larger than the fourth operation voltage;
a protection device coupled to at least one of the first power terminal, the first ground terminal, the second power terminal, and the second ground terminal and comprising:

a substrate having a first conductivity type;
a first doped region disposed in the substrate and having a second conductivity type;
a first well region disposed in the first doped region and having the first conductivity type;
a second doped region disposed in the first doped region and having the second conductivity type, wherein the second doped region is not in contact with the first well region;
a third doped region disposed in the first well region and having the first conductivity type;
a fourth doped region disposed in the first well region and having the second conductivity type;
a second well region disposed in the substrate and having the second conductivity type;
a fifth doped region disposed in the second well region and having the first conductivity type; and
a sixth doped region disposed in the second well region and having the second conductivity type,
wherein the first conductivity type is different from the second conductivity type.

13. The operation system as claimed in claim 12, wherein the third doped region is electrically connected to the first ground terminal, and the sixth doped region is electrically connected to the second ground terminal.

14. The operation system as claimed in claim 13, wherein the second doped region is electrically connected to the first power terminal or the first ground terminal or is floating.

15. The operation system as claimed in claim 12, wherein the third doped region is electrically connected to the first power terminal, and the sixth doped region is electrically connected to the second power terminal.

16. The operation system as claimed in claim 12, wherein the second doped region is electrically connected to the first power terminal or is in a floating state.

17. The operation system as claimed in claim 12, wherein the first conductivity type is different from the second conductivity type.

18. The operation system as claimed in claim 12, wherein the protection device further comprises:
a seventh doped region disposed in the substrate and having the second conductivity type;
a third well region disposed in the seventh doped region and having the first conductivity type;
an eighth doped region disposed in the seventh doped region and having the second conductivity type, wherein the eighth doped region is not in contact with the third well region;
a ninth doped region disposed in the third well region and having the first conductivity type; and
a tenth doped region disposed in the third well region and having the second conductivity type.

19. The operation system as claimed in claim 18, wherein the protection device further comprises:
a first conductive line electrically connected to the fourth and fifth doped regions; and
a second conductive line electrically connected to the sixth and ninth doped regions.

20. The operation system as claimed in claim 18, wherein the protection device comprises:
a first conductive line electrically connected to the fourth and ninth doped regions; and
a second conductive line electrically connected to the fifth and tenth doped regions.

* * * * *